United States Patent [19]

Johnston

[11] 3,789,271

[45] Jan. 29, 1974

[54] CIRCUIT BOARD ASSEMBLY

[75] Inventor: James J. Johnston, Cheshire, Conn.

[73] Assignee: Automatic Equipment Development Corporation, West Haven, Conn.

[22] Filed: Nov. 29, 1972

[21] Appl. No.: 310,650

[52] U.S. Cl. .... 317/101 CC, 339/150 B, 324/158 F

[51] Int. Cl. .............................................. H05k 1/04

[58] Field of Search 324/158 F; 339/17, 18 B, 150 B; 317/101 CC

[56] References Cited

UNITED STATES PATENTS 3,302,065 1/1967 Karol et al. ........................ 339/18 B

FOREIGN PATENTS OR APPLICATIONS 625,388 6/1949 Great Britain .................. 339/150 B

OTHER PUBLICATIONS

Bruder, S.I., "Insertion/Extraction Test Socket" I.B.M. Tech. Bull. Vol. 13, No. 5. October 1970

Ross. T., "Test Socket," IBM Tech. Disclosure Bull., Vol 10, No. 5, October 67

*Primary Examiner*—David Smith, Jr.

*Attorney, Agent, or Firm*—Frederick J. Haesche

[57] ABSTRACT

A circuit board assembly comprising a frame having a stack of printed circuit boards mounted in fixed position thereon and having circuit means associated therewith. Each circuit board carries a plurality of resilient electrically conductive pin connectors which project from opposite surfaces thereof and extend through other circuit boards which comprise the stack. A pressure plate supported on the frame in generally parallel relation to the stack includes another circuit board which has circuit means and holes therethrough which receive the pins associated with the stack. Each hole defines a clamping surface and has a cross-sectional area substantially greater than the cross-sectional area of an associated portion of a pin received therein. The pressure plate is supported for shifting movement in one and an opposite direction relative to the frame and transversely of the pins between open and closed positions. When the pressure plate is in its open position, a lead of an associated circuit component may be freely inserted into each hole between the clampin surface thereof and the pin received therein. When the pressure plate is in its closed position, the clamping surface exerts a biasing force on the loead and on the pin associated therewith to clamp the lead in electrically connected engagement with the pin and clamping surface to establish electrical circuit continuity between the leads and circuit means associated with the various circuit boards. A clamping screw on the frame is provided for moving th pressure plate to and releasably retaining it in its closed position.

14 Claims, 8 Drawing Figures

PATENTED JAN 29 1974 3,789,271

CIRCUIT BOARD ASSEMBLY

BACKGROUND OF THE INVENTION

This invention relates in general to circuit boards and deals more particularly with an improved circuit board assembly for releasably retaining circuit components in electrically connected relation with one or more electrical circuits associated therewith.

The development of the large scale integrated circuit components has made possible the manufacture of very complex systems, such as electronic computers, having manageable dimensions and has also created a demand for improved electronic packaging concepts. It is highly desirable that such systems be maintainable, or more specifically that the various individual circuit components which comprise a system be readily removable from the system for repair or replacement. Heretofore, various circuit board assemblies have been provided which include plugable sockets for receiving leads associated with individual circuit components. However, such plugable socket arrangements generally require that a substantial degree of force be applied to the individual component to establish plug-in engagement with the socket. Each time a component is plugged into or removed from an associated socket both of the component leads and the socket are subjected to possible damage from the forces exerted thereon. It will also be obvious that the repeated removal or replacement of components may result in loss of socket retention force accompanied by increase in contact resistance adversely effecting the operational characteristics of the system.

It is the general aim of the present invention to provide an improved circuit board assembly for receiving and releasably retaining circuit components in electrically connected assembly therewith. In accordance with the present invention, the circuit components are assembled with or removed from the circuit board assembly without application of force, thereby protecting circuit component terminals or leads and associated connecting portions of the circuit board assembly from possible damage which could increase contact resistance at points of connection therebetween. The present circuit board assembly is adapted to receive and retain discrete circuit components and/or small, medium or large integrated circuit packages, as may be required in the construction of any electrical circuit or network of circuits. The present circuit board assembly further provides for low impedence power distribution, high density packaging, and interface capability compatable with industry standards.

SUMMARY OF THE INVENTION

In accordance with the present invention, an improved circuit board assembly is provided which comprises a circuit board which has circuit means and a resilient electrically conductive pin connector mounted thereon and projecting from at least one surface thereof. The assembly also includes a pressure plate comprises another circuit board which which has a hole therethrough for receiving an associated portion of the pin therein. The hole defines a clamping surface and has a cross-sectional area substantially greater than the cross-sectional area of the associated portion of the pin received therein. Means is provided for supporting the pressure plate in generally parallel relation to the circuit board with the pin connector disposed in the hole and for movement in one and an opposite direction generally transversely of the pin connector between open and closed positions to move the clamping surface respectively toward and away from the pin connector. When the pressure plate is in its open position, the clamping surface is spaced a sufficient distance from the pin connector to permit a lead or terminal associated with the circuit component to be inserted into the hole between the clamping surface and the pin and to pass freely therebetween. When the pressure plate is in its closed position, the clamping surface engages and biases the lead into electrically connected relation with the pin connector and also biases the resilient pin connector in a transverse direction slightly beyond its normal axial position whereby electrical connection is established between the lead and circuit means associated with the circuit boards. Means is provided for releasably retaining a pressure plate in its closed position.

DETAILED DESCRIPTION OF THE PREFERRED EMBODIMENT

Figure 1:
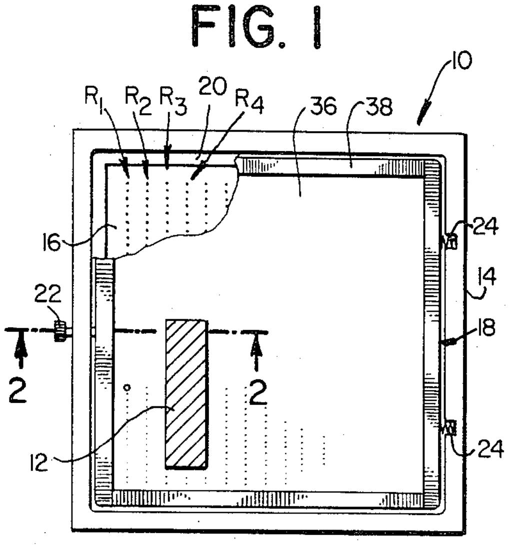
FIG. 1 is a plan view of a circuit board assembly embodying the present invention shown with a circuit component releasably connected thereto.
Figures 2, 3:
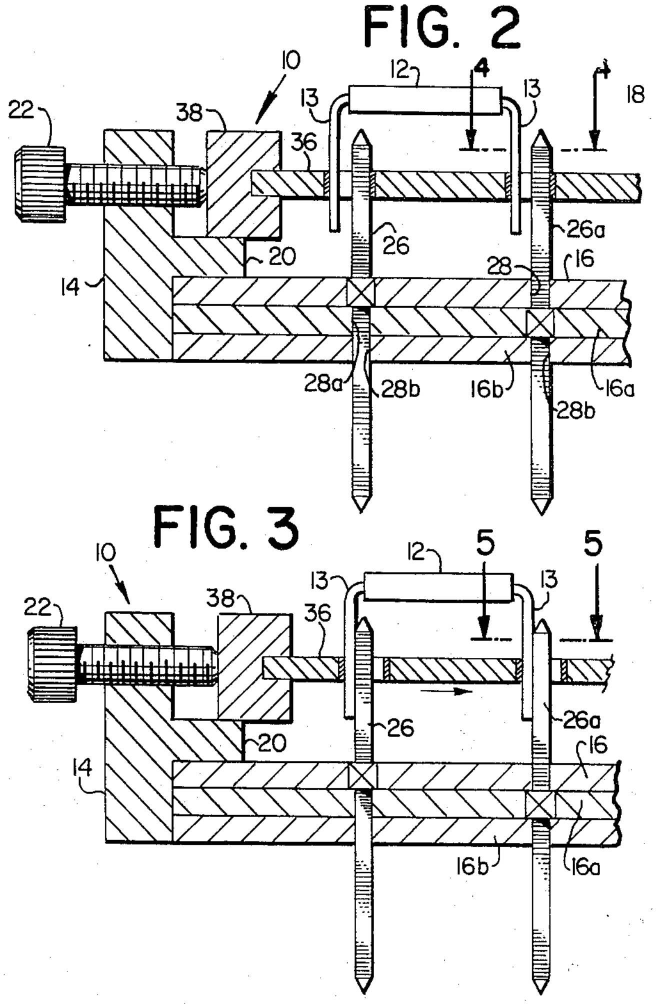
FIG. 2 is a somewhat schematic enlarged fragmentary sectional view taken along the line 2—2 of FIG. 1, and shows the pressure plate in open position.
FIG. 3 is generally similar to FIG. 2, but shows the pressure plate in closed position.

Turning now to the drawing, and referring first particularly to FIGS. 1 and 3, a circuit board assembly embodying the present invention and indicated generally by the reference numeral 10 is shown with a circuit component 12 releasably retained in electrically connected relation therewith. The illustrated component 12 comprises a dual in-line large scale integrated circuit package which has two parallel rows of leads or terminals 13, 13. The assembly 10 generally comprises a support frame 14, at least one circuit board 16 mounted in fixed position on the frame and a pressure plate indicated generally at 18 supported on the frame for movement between clamping and releasing positions relative to the circuit board. The pressure plate cooperates in its clamping position with a plurality of resilient electrically conductive pin connectors associated with the circuit board to releasably retain the circuit component 12 in electrically connected relationship with one or more circuits associated with the circuit board.

The support frame 14 is preferably made from aluminum, has a generally rectangular configuration and is rabbeted along its upper and lower inner edges to form a central inwardly projecting rib 20, which provides seating surfaces for the circuit board 16 and the pressure plate 18, as shown in FIGS. 2 and 3. A clamping screw 22 is threaded centrally through one side of the frame 14 above the rib 20 for a purpose to be hereinafter further discussed. The frame 14 also has a pair of inwardly opening recesses formed in the side thereof opposite the clamping screw and above the rib 20. Each recess contains a compression spring 24 shown in FIG. 1.

Figure 6:
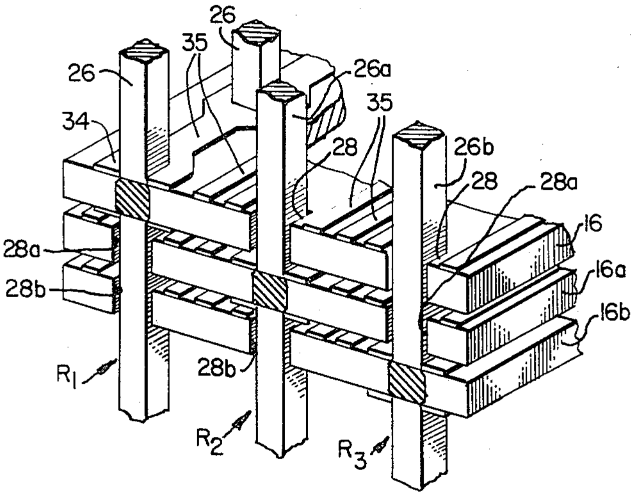
FIG. 6 is a somewhat enlarged fragmentary perspective view of a circuit board stack.

As previously noted, the invention may be practiced with a single circuit board 16, however, preferably, and as shown, the assembly 10 includes a multi-layer stack of standard double sided printed circuit boards which includes the circuit board 16 and two generally similar circuit boards designated 16*a* and 16*b*. Each circuit board has a plurality of rows of resilient electrically conductive pin connectors mounted thereon and respectively designated 26, 26; 26*a*, 26*a*; and 26*b*, 26*b* which cooperate with the pressure plate 18. Referring now to FIG. 6, the circuit board stack is formed by selectively mounting pin connectors in each of the circuit boards which comprise the stack. Clearance holes or apertures, respectively designated 28, 28; 28*a*, 28*a*; and 28*b*, 28*b*, are also formed in each of the boards to receive pins mounted in the other of the boards therethrough, so that the formed stack has pins projecting from both sides thereof, substantially as shown.

The particular mounting arrangement of the pin connectors in the circuit boards which comprise the stack may vary and will, of course, be determined particular circuit requirements of the system in which the assembly is to be used. The illustrated assembly 10 has pin connectors arranged in a grid pattern as shown in FIG. 1. The pattern comprises a plurality of vertically disposed horizontally spaced rows designated $R_1$, $R_2$, $R_3$, etc. Further referring to FIG. 6, the row $R_1$ includes a plurality of pin connectors 26, 26, mounted in the circuit board 16. The pin connectors 26*a*, 26*a* which comprise the row $R_2$ are arranged in parallel relation to the pin connectors 26, 26 mounted in the board 16*a* and project upwardly through clearance holes 28, 28 formed in the board 16, as shown. The pin connectors 26*b*, 26*b* are mounted in the circuit board 16*b* and extend upwardly through clearance holes 28*a* and 28 respectively formed in the circuit boards 16*a* and 16. In the illustrated case, the pattern is a repetitive one, that is, the next successive row $R_4$ (not shown) comprises pins 26, 26 associated with the circuit board 16 and passing downwardly through clearance holes in the circuit boards 16a and 16*b* therebelow.

The pin connectors may vary in size and shape, but preferably, and as shown, 0.025 square pin connectors are employed. In accordance with one preferred arrangement (not specifically illustrated) the pins are arranged in a grid pattern comprising 38 rows on 0.300 inch spacing, 75 pins to a row, the pins being spaced on 0.100 inch centers. The aforesaid grid pattern occupies an effective pin area 7.6 inches square on an 8.3 inch square stack. The aforesaid arrangement is particularly suitable for a high density integrated circuit structure.

Figure 8:
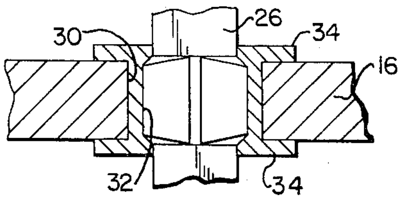
FIG. 8 is a somewhat enlarged fragmentary view of a circuit board-pin connector junction, the circuit board being shown in section.

In accordance with the present invention, each pin connector is mounted in an associated circuit board in a plated through hole. A typical pin mounting is illustrated in FIG. 8, wherein the pin connector 26 is mounted in the board 16 through a plated hole 30. More specifically, the board 16 is made from electrical insulating material and has a hole 30 therethrough which has a lining 32 of electrically conductive material. The lining 32 preferably comprises a plated coating of electrically conductive metal and in the illustrated case a lining of 0.0015 inches of tin-plated copper is employed. The lining 32 includes an integral flange portion 34 which surrounds the pin 26 adjacent one or both surfaces of the board 16. The pin connector 26 is preferably plated with electrically conducted material, such as gold (30 uu) over nickle (50 uu), and is staked into assembly with the board 16 through the lining 32. Each pin connector has a special shape at its point of joinder with a circuit board so that a gas-tight bond develops between the pin connector and the relatively thick ductile metal hole lining in which it is received. Thus, the pin connectors are assembled to the various circuit boards at plated through junctions which provide extremely reliable electrical connection between the art work associated with the boards and the pin connectors. The art work or printed circuits indicated at 35, 35 in FIG. 6 are connected to the pin junctions at the flanges 34, 34.

Figure 7:
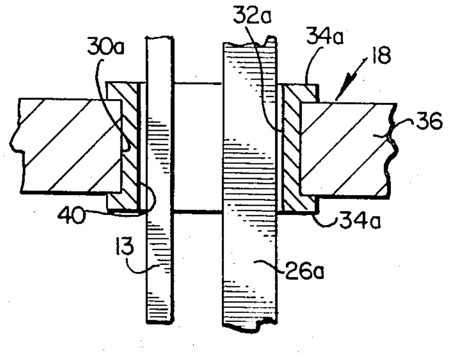
FIG. 7 is a fragmentary sectional view of the pressure plate taken along the line 7—7 of FIG. 4.

The pressure plate assembly 18 includes a plate 36 which preferably comprises another circuit board having art work on one or both sides thereof. The plate 36 is retained in a rectangular mounting frame 38 which is received in the support frame 14 and rests upon the rib 20. The plate 36 has a plurality of holes 30*a*, 30*a* formed therein and equal in number to the pin connectors associated with the circuit board stack. The holes 30*a*, 30*a* are preferably cylindrical and arranged in a grid pattern identical to the connector pin grid pattern. Each hole 30*a* receives an associated portion of a pin such as 26 therethrough. The plate 36 is preferably made from electrically insulating material. Each hole 30*a* formed therein has a lining or plated coating 32*a* of electrically conductive material which includes integral flanges 34*a*, 34*a* which surround the hole adjacent both surfaces of the plate 36, as best shown in FIG. 7. The lining 30*a* preferably comprises a plating of gold or like electrically conductive material and defines a clamping surface 40. Each plated hole 32*a* is preferably generally cylindrical and has a cross-sectional area substantially greater than the cross-sectional area of an associated portion of a pin connector received therein.

The pressure plate 18 is supported on the support frame 14 for movement relative thereto and transversely of the pin connectors 26–26*b* between a releasing or open position, shown in FIG. 2, and clamping or closed position, shown in FIG. 3.

The assembly 10 is adapted to receive and releasably retain one or more discrete circuit components as for example, individual transistors and/or small, medium and large integrated circuit packages. However, the manner in which a typical circuit component is attached to or released from the assembly 10 is hereinafter described with reference to the IC package 12 and FIGS. 2–5 and 7.

Figures 4, 5:
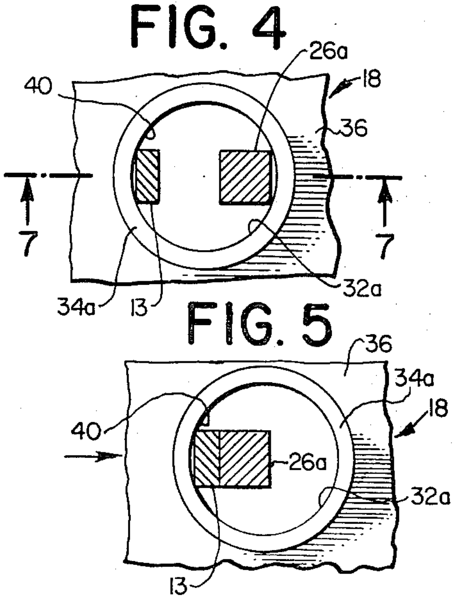
FIG. 4 is a somewhat further enlarged fragmentary sectional view taken generally along the line 4—4 of FIG. 2.
FIG. 5 is an enlarged fragmentary sectional view taken along the line 5—5 of FIG. 3.

Preparatory to receiving the component 12, the clamping screw 22 is loostened to permit the springs 24, 24 to bias a pressure plate 18 to its open position, as it appears in FIG. 2. When the pressure plate is in its open position, each pin connector is spaced a substantial distance from an associated clamping surface. Referring particularly to FIGS. 4 and 7, where the pressure plate 18 is shown in its open position, the clamping surface 40 is spaced a sufficient distance from the pin 26*a* to permit a lead 13 to be inserted into the hole 32*a* and to pass freely between the pin 26*a* and the clamping surface 40. It will be now apparent that each of the leads 13 may be freely inserted or dropped into an associated pressure plate hole 32*a* without application of force. When the component 12 has been positioned generally as shown in FIG. 2, the pressure plate 18 is moved to its closed or clamping position by tightening the clamping screw 22 which causes the pressure plate to move transversely of the pins 26, 26*a*.

The pressure plate is in its clamping position (FIG. 3), it exerts a slight biasing force upon the leads 13, 13 and upon the pin connectors 26 and 26*a* to effect slight transverse deflection of the pins relative to their normal axial positions. Each resilient pin connector in its slightly biased or deflected position exerts a substantial force on an associated lead 13 to securely clamp the lead between the pin and an associated clamping surface. Each pin connector has a large flat conductive surface for engagement with an associated lead for a dry circuit resistance to assure a high integrity electrical connection.

In the illustrated embodiment 10, the three layer circuit board stack provides six layers of fine line art work. Access to all of the layers is quickly achieved by disassembling each of the printed circuits from the multi-layer stack. Interconnection between the layers which comprise the stack may be achieved through the pressure plate or through wire wrap connection of the exposed pin connectors which project from the lower side of the stack. The flanges 34, 34 and the associated plated through junctions on the circuit boards may be employed for art work crossovers within a single layer. The flanges 34*a*, 34*a* and associated plated through holes in the pressure plate 18 may also serve as art work crossovers for circuits on opposite surfaces of the pressure plate. The pressure plate is particularly suited to carry ground and voltage distribution circuits and is readily removable to facilitate maintenance, replacement, or design change. The elimination of solder connections and supplemental mounting hardware facilitates maximum utilization of available circuit board area for fine line art work.

I claim:

1. A circuit board assembly for releasably retaining a circuit component in electrically connected relation with circuit means associated with said assembly and comprising a first circuit board having a plurality of parallel resilient electrically conductive first pin connectors mounted thereon and projecting from at least one surface thereof generally normal thereto, said first circuit board having first printed circuit means thereon electrically connected to at least one of said first pin connectors, a pressure plate including a second circuit board having second printed circuit means thereon and including a plurality of holes therethrough, each of said holes defining a clamping surface receiving an associated one of said first pin connectors therein, at least one of said holes having a lining of electrically conductive material defining said clamping surface and electrically connected to said second printed circuit means, each of said holes having a cross-sectional area substantially greater than the cross-sectional area of an associated portion of an associated first pin connector received therein, means for supporting said pressure plate in generally parallel relation to said first circuit board for movement in one and an opposite direction generally transversely of said pin connectors and relative to said first circuit board between open and closed positions to simultaneously move each of said clamping surfaces respectively toward and away from an associated one of said pin connectors, each of said clamping surfaces in said open position being spaced from an associated one of said pin connectors a distance sufficient to permit a lead on a circuit component to be inserted freely therebetween, each of said clamping surfaces in said closed position being adapted to exert biasing force on an associated one of said pin connectors when a lead on a circuit component is positioned between said one pin connector and the clamping surface associated therewith to clampingly engage and releasably retain the latter lead, and means for releasably retaining said pressure plate in said closed position.

2. A circuit board assembly as set forth in claim 1 wherein at least one of said circuit boards has electrically connected circuit means associated with opposite surfaces thereof.

3. A circuit board assembly as set forth in claim 1 including means for biasing said pressure plate toward said open position.

4. A circuit board assembly as set forth in claim 3 wherein said means for releasably retaining said pressure plate comprises means for moving said pressure plate from said open position to said closed position.

5. A circuit board assembly as set forth in claim 1 wherein said means for supporting said pressure plate comprises a frame, said first circuit board is mounted in fixed position on said frame and said pressure plate is supported on said frame for movement relative thereto between said open and closed positions.

6. A circuit board assembly as set forth in claim 5 wherein each of said holes is generally cylindrical and each of said first pin connectors has a non-circular cross section.

7. A circuit board assembly as set forth in claim 6 wherein each of said first pin connectors has a generally rectangular cross section.

8. A circuit board assembly as set forth in claim 5 wherein said means for releasably retaining said pressure plate comprises a clamping screw threadably engaging said frame and bearing on said pressure plate.

9. A circuit board assembly as set forth in claim 5 including means for biasing said pressure plate toward said open position.

10. A circuit board assembly as set forth in claim 9 wherein said means for biasing said pressure plate comprises a spring acting between said frame and said pressure plate.

11. A circuit board assembly as set forth in claim 1 wherein said lining comprises a plated coating of electrically conductive material.

12. A circuit board assembly as set forth in claim 11 wherein said plated coating includes an annular flange surrounding said one hole adjacent an associated surface of said second circuit board and said second printed circuit is electrically connected to said flange.

13. A circuit board assembly as set forth in claim 1 including a third circuit board parallel to said first circuit board and having another resilient electrically conductive third pin connector mounted thereon and projecting from at least one surface thereof, said third circuit board having third circuit means thereon electrically connected to said third pin connector, said first circuit board having a aperture therethrough receiving said third pin connector therethrough, said supporting means supporting said pressure plate for movement between said open and closed positions relative to both said first and said third circuit boards, said second circuit board having another hole therethrough defining another clamping surface and receiving an associated portion of said third pin connector therein, said other hole having a cross-sectional area substantially greater than the cross-sectional area of said associated portion of said third pin connector, said other hole having a lining of electrically conductive material defining said other clamping surface and electrically connected to said first printed circuit means, said other clamping surface in said open position of said pressure plate being spaced from said third pin connector a distance sufficient to permit a lead of a circuit component to be inserted into said other hole between said other clamping surface and said third pin connector and to pass freely therebetween, said other clamping surface in said closed position of said pressure plate being adapted to clamp the latter lead in engagement with said the pin connector and to exert biasing force on said third pin connector.

14. A circuit board assembly as set forth in claim 13 wherein the cross-sectional area of said aperture is substantially greater than the cross-sectional area of an associated portion of said third pin connector disposed in said aperture.

* * * * *

UNITED STATES PATENT OFFICE
CERTIFICATE OF CORRECTION

Patent No. 3,789,271 Dated January 29, 1974

Inventor(s) James J. Johnston

It is certified that error appears in the above-identified patent and that said Letters Patent are hereby corrected as shown below:

In the Abstract:

Line 21, "clampin" should read --clamping--.

Line 24, "loead" should read --lead--.

Line 29, "th" should read --the--.

Col. 1, line 61, after "pressure plate" insert --which--.

Col. 1, line 62, "which which" should be --which--.

Signed and sealed this 16th day of July 1974.

(SEAL)
Attest:

McCOY M. GIBSON, JR.
Attesting Officer

C. MARSHALL DANN
Commissioner of Patents